United States Patent
Yoneya

(10) Patent No.: US 7,038,560 B2
(45) Date of Patent: May 2, 2006

(54) SURFACE ACOUSTIC WAVE FILTER AND SURFACE ACOUSTIC WAVE RESONATOR HAVING BENT ELECTRODE FINGERS

(75) Inventor: Katsuro Yoneya, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 104 days.

(21) Appl. No.: 10/870,134

(22) Filed: Jun. 16, 2004

(65) Prior Publication Data

US 2005/0030129 A1 Feb. 10, 2005

(30) Foreign Application Priority Data

Jun. 19, 2003 (JP) ............................. 2003-175018

(51) Int. Cl.
  *H03H 9/64* (2006.01)
  *H03H 9/25* (2006.01)
(52) U.S. Cl. ................................. 333/195; 310/313 D
(58) Field of Classification Search ........ 333/193–196; 310/313 B, 313 D
See application file for complete search history.

(56) References Cited

U.S. PATENT DOCUMENTS

| 4,028,649 | A | * | 6/1977 | Komatsu et al. | ............. | 333/194 |
| 4,203,082 | A | | 5/1980 | Tsukamoto et al. | ......... | 333/194 |
| 5,670,920 | A | | 9/1997 | Morgan | ...................... | 333/195 |
| 6,525,629 | B1 | * | 2/2003 | Matsuda et al. | ............. | 333/195 |
| 6,856,214 | B1 | * | 2/2005 | Jian et al. | .................... | 333/154 |

FOREIGN PATENT DOCUMENTS

| DE | 42 23 001 C1 | 7/1992 |
| EP | 0 088 493 A2 | 1/1983 |
| JP | 60-043912 | 3/1985 |

OTHER PUBLICATIONS

"Experimental Investigation o n the Operation of SAW devices . . . " Publication by T. Sato et al. 1996 IEEE Ultrasonics Symposium pp. 267-270, Nov. 1996.
European Search Report for Application No. EP 04 01 4049 dated Nov. 8, 2004.

* cited by examiner

*Primary Examiner*—Barbara Summons
(74) *Attorney, Agent, or Firm*—Anderson Kill & Olick, PC; Eugene Lieberstein; Richard Klar

(57) ABSTRACT

A SAW filter including a piezoelectric substrate 11, an input electrode 12 and an output electrode 13 each representing an interdigital electrode disposed on the piezoelectric substrate 11 and two reflectors 14 and 14 disposed on the piezoelectric substrate 11 in an arrangement sandwiching both the input electrode 12 and the output electrode 13 between the reflectors. Each of the electrodes 12 and 13 include a plurality of electrode fingers 121, 122 and 131, 132 respectively. The electrode fingers are partially bent at an angle and include at least two linear sections which are spaced at a distance of $\lambda/2$ from one another in the propagating direction of the SAWs. The electrode fingers 131 and 132 of the output electrode 13 and electrode fingers 141 of the reflector 14 are structured similarly to the electrode fingers 121 and 122 of the input electrode 12.

2 Claims, 8 Drawing Sheets

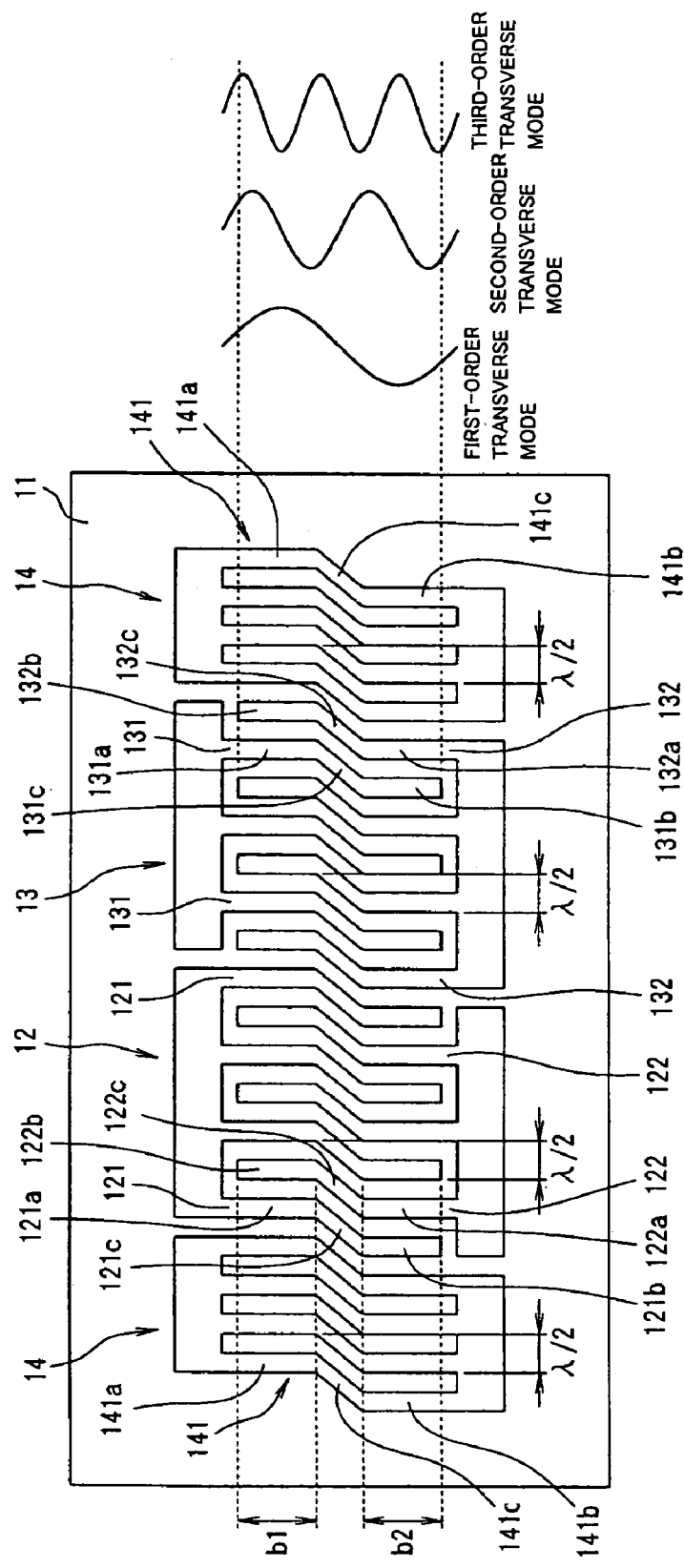

[FIG. 2]
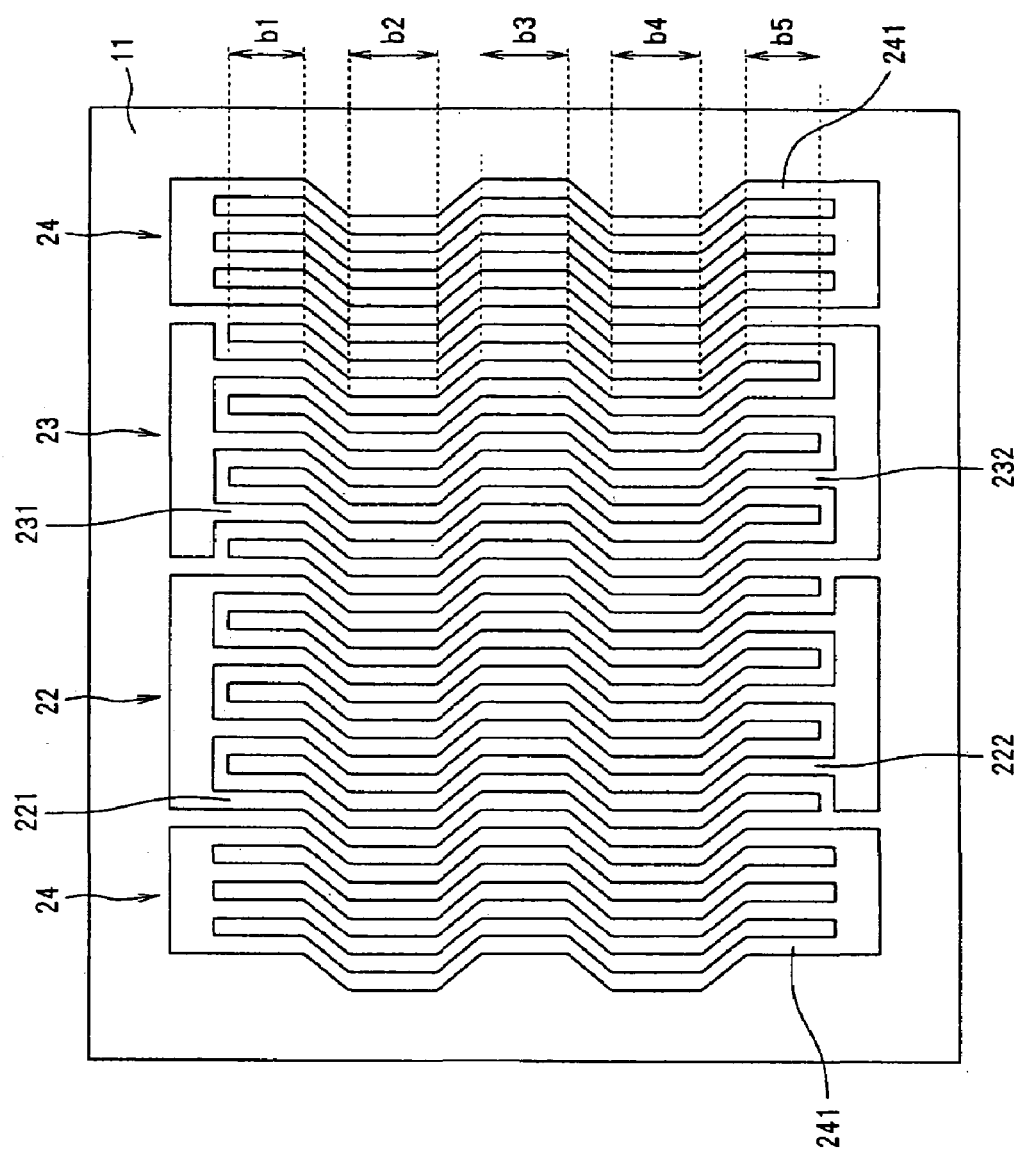

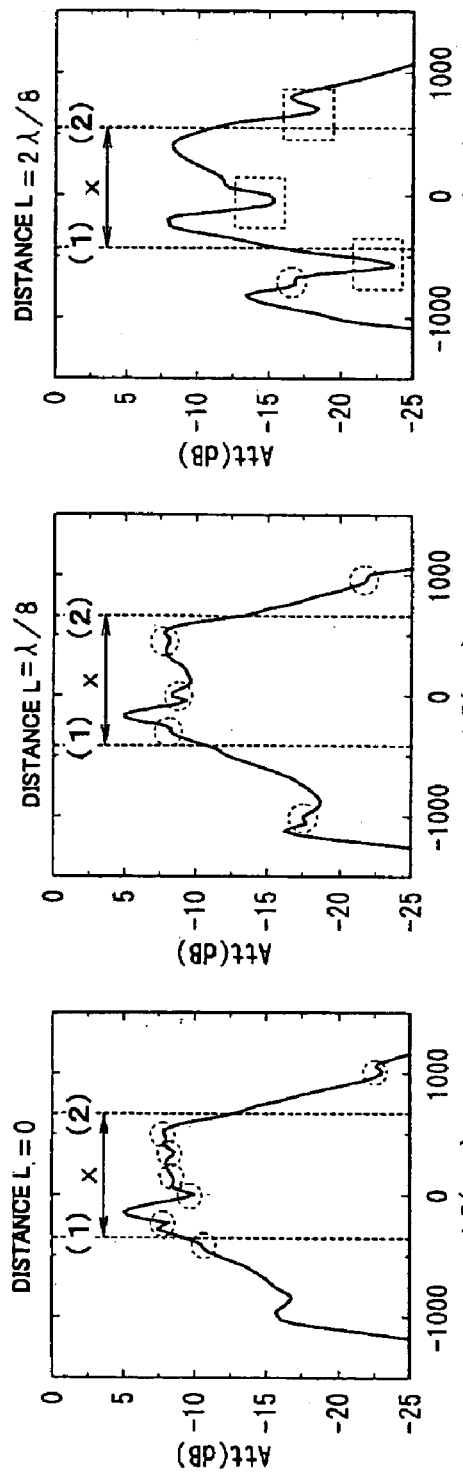

[FIG. 4]
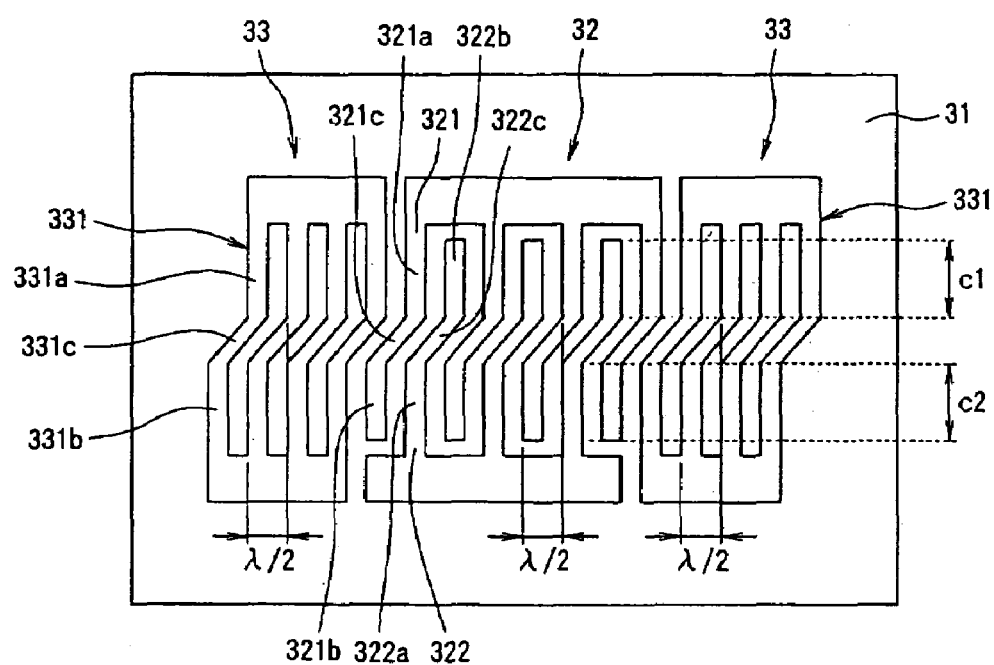

[FIG. 5]
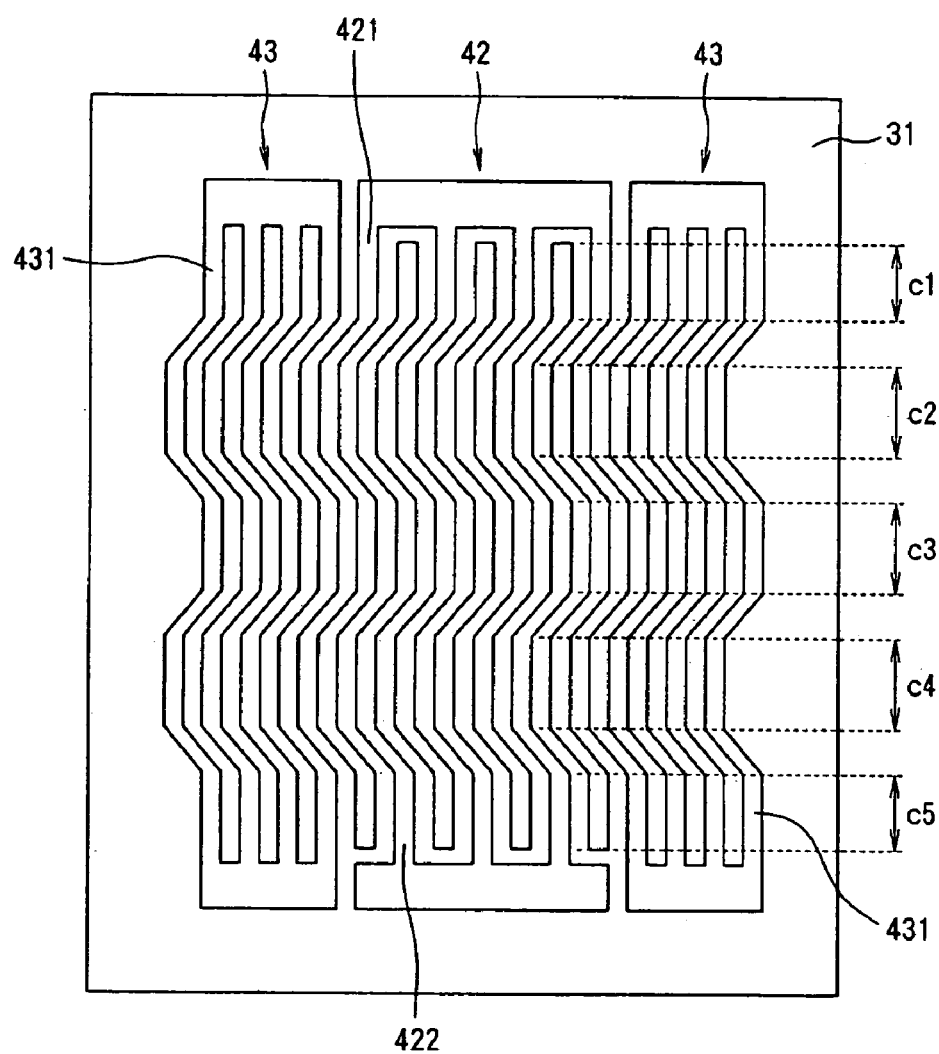

[FIG. 6a]
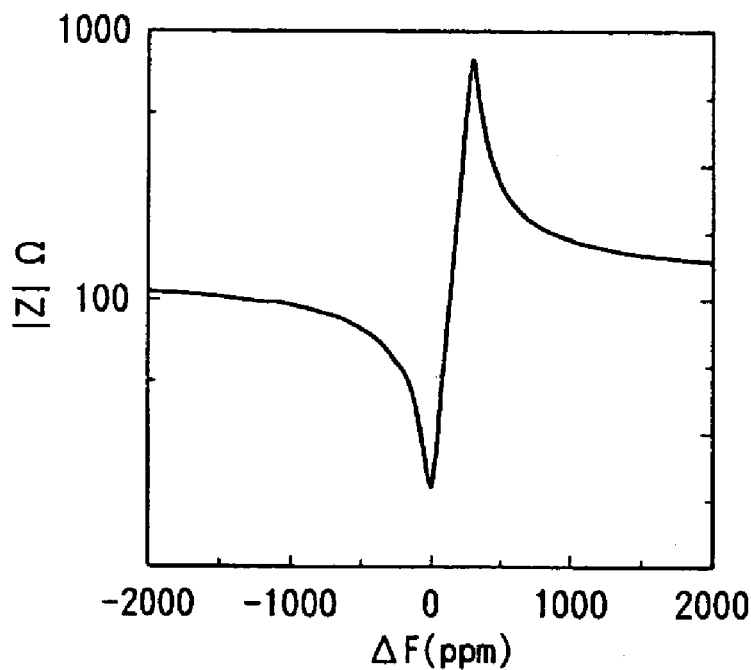
[FIG. 6b]
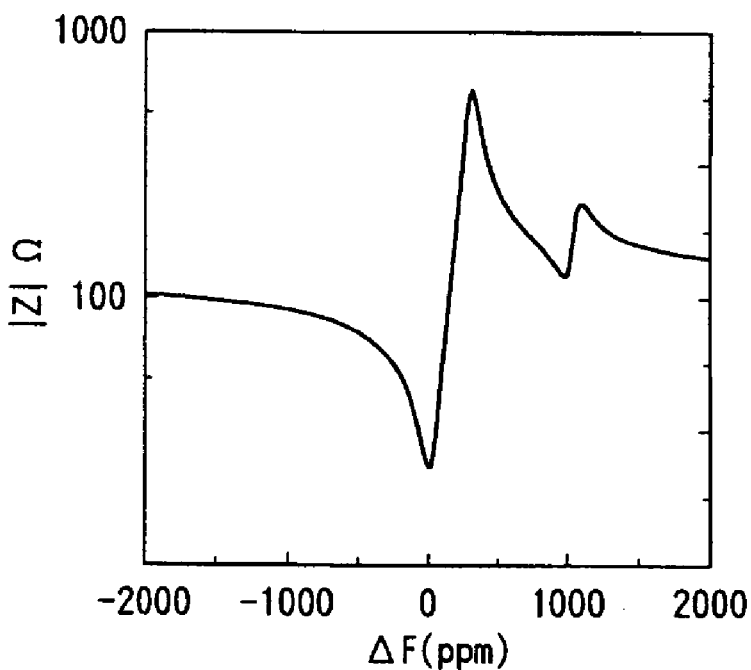

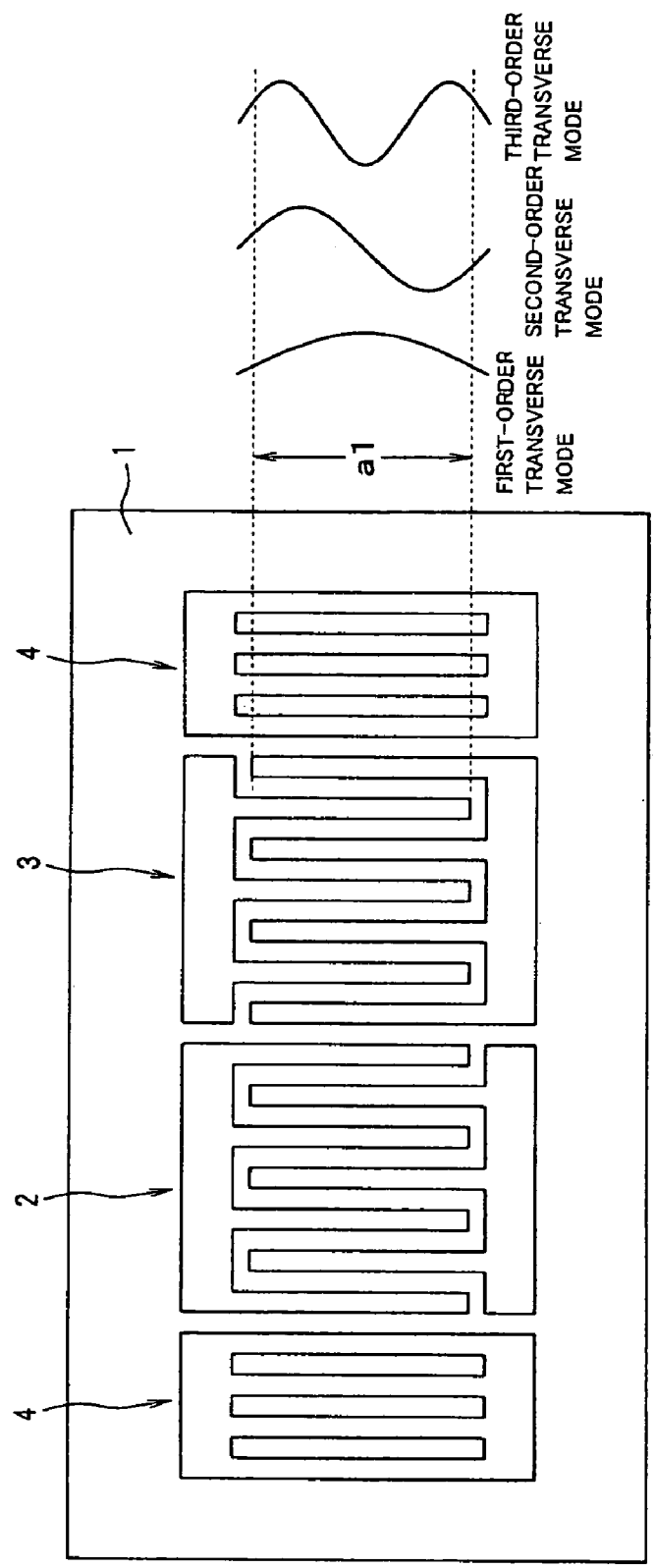
[FIG. 7]

[FIG. 8]
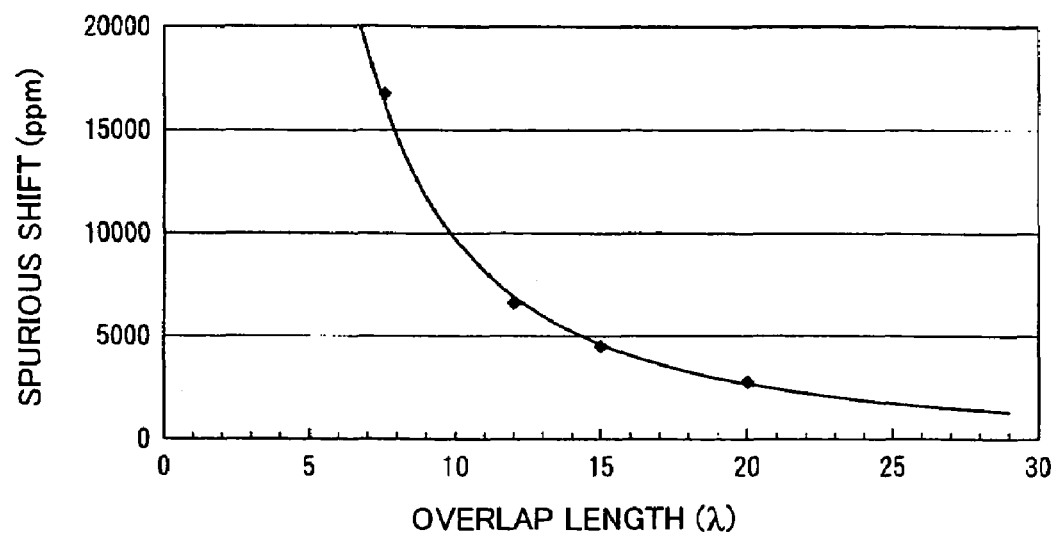

SURFACE ACOUSTIC WAVE FILTER AND SURFACE ACOUSTIC WAVE RESONATOR HAVING BENT ELECTRODE FINGERS

TECHNICAL FIELD OF THE INVENTION

The present invention relates to surface acoustic wave (SAW) filters and SAW resonators, specifically to those with improved electrode structures.

DESCRIPTION OF THE RELATED ART

A SAW filter is used, as a filter for high frequency bands, in a wide range of applications. As shown in FIG. 7, the SAW filter includes, for example, a piezoelectric substrate 1, an input electrode 2 and an output electrode 3. The input electrode 2 and output electrode 3 each comprise an interdigital electrode having a plurality of electrode fingers that are disposed on the piezoelectric substrate. The SAW filter further includes two reflectors 4 and 4 that are disposed on the piezoelectric substrate 1 sandwiching both the input electrode 2 and the output electrode 3.

The piezoelectric substrate 1 of the described SAW filter is made of, for example, quartz and generally requires a load impedance as low as possible to match the impedance to 50Ω. A known method for lowering the impedance is to increase the overlap length (length of opposing sections of electrode fingers) "a1" of the input electrode 2 and the output electrode 3.

If the overlap length of the input/output electrodes 2 and 3 is too large this leads to the occurrence of resonance in the transverse mode in which energy is transmitted in the direction orthogonal to the propagating direction of the SAWs. The resonance in the transverse mode causes spurious responses, which result in degradation of the passband characteristics of the SAW filter.

In the structure shown in FIG. 7, vibrational energy in second-order or higher transverse modes as well as in first-order transverse mode is confined in the direction of the overlap length a1 of the input/output electrodes 2 and 3 (see waveforms in FIG. 7). Although resonance in the first-order transverse mode becomes primary responses, resonance in the second-order or higher transverse modes becomes spurious responses. In particular, electric charges in the second-order transverse mode cancel each other out in the input/output electrodes 2 and 3, whereas electric charges in the third-order transverse mode do not cancel each other out and appear as spurious responses in the filter characteristic. That is, electric charges in the odd-order transverse mode appear as spurious responses, while electric charges in the even-order transverse mode cancel each other out.

FIG. 8 shows an example of the relationship between the overlap length of the input/output electrodes 2 and 3, and the shift (deviation from the filter's center frequency) of the spurious responses in transverse mode. According to FIG. 8, the more the overlap length increases, the more the spurious responses approach the center frequency of the filter.

A known method to prevent spurious responses is to use apodization for varying the overlap length of the input/output electrodes 2 and 3. However, this results in a reduced overlap length, which in turn increases load impedance.

Accordingly, an object of the present invention is to provide a low-impedance SAW filter and SAW resonator that can eliminate the effects of spurious responses caused by resonance in higher transverse modes.

SUMMARY OF THE INVENTION

The SAW filter of the present invention includes a piezoelectric substrate; input/output electrodes comprised of interdigital electrodes each having a plurality of electrode fingers disposed on the piezoelectric substrate; and two reflectors disposed on the piezoelectric substrate in an arrangement sandwiching the input/output electrodes between the reflectors with each reflector having a plurality of electrode fingers. Each electrode finger of the input/output electrodes is partially bent at an angle and has at least two linear sections at a distance L1 from one another in the propagating direction of the SAWs. Each electrode finger of the reflector is partially bent at an angle and has at least two linear sections at a distance L2 from one another in the propagating direction of the SAWs. The distance L1 and the distance L2 satisfy the relationship: $3\lambda/8 \leq L1 \leq 5\lambda/8$ and $3\lambda/8 \leq L2 \leq 5\lambda/8$, respectively, where $\lambda$ represents the wavelength of the SAWs.

In accordance with one embodiment of the present invention, each electrode finger of the input/output electrodes has at least two linear sections each having a small overlap length. Although the overlap length of each linear section is small, impedance can be reduced because of the large total overlap length.

Moreover, since each linear section of the input/output electrodes has a small overlap length, spurious responses in transverse mode are away from the filter passband, and thus, effects of undesired spurious responses can be eliminated.

According to a second aspect of the present invention, a SAW resonator includes a piezoelectric substrate; an interdigital electrode disposed on the piezoelectric substrate and including a plurality of electrode fingers; and two reflectors disposed on the piezoelectric substrate in an arrangement sandwiching the interdigital electrode between the reflectors with each reflector having a plurality of electrode fingers. Each electrode finger of the interdigital electrode is partially bent at an angle and has at least two linear sections at a distance L1 from one another in the propagating direction of the SAWs. Each electrode finger of the reflector is partially bent at an angle and has at least two linear sections at a distance L2 from one another in the propagating direction of the SAWs. The distance L1 and the distance L2 satisfy the relationship: $3\lambda/8 \leq L1 \leq 5\lambda/8$ and $3\lambda/8 \leq L2 \leq 5\lambda/8$, respectively, where $\lambda$ represents the wavelength of the SAWs.

In the second aspect of the present invention, each electrode finger of the interdigital electrode has at least two linear sections. Although the overlap length of each linear section is small, impedance at resonance can be reduced because of the large total overlap length.

Moreover, since each linear section of the interdigital electrode has a small overlap length, spurious responses in transverse mode are away from the resonance frequency, and thus, effects of undesired spurious responses can be eliminated.

BRIEF DESCRIPTION OF THE DRAWINGS

Other advantages of the invention will become apparent from the following detailed description of the invention when read in conjunction with the accompanying drawings of which:

FIG. 1 is a plan view of a first embodiment of the SAW filter of the present invention.

FIG. 2 is a plan view of a second embodiment of the SAW filter of the present invention.

FIG. 3 are diagrams of filter characteristics of the prototypes of the SAW filter according to the present invention.

FIG. 4 is a plan view of the SAW resonator in the first embodiment of the present invention.

FIG. 5 is a plan view of the SAW resonator in the second embodiment of the present invention.

FIG. 6 shows a prototype frequency characteristic of the SAW resonator according to the present invention.

FIG. 7 is a plan view of a conventional SAW filter and

FIG. 8 shows an example relationship between overlap lengths and spurious shifts.

DETAILED DESCRIPTION OF THE PREFERRED EMBODIMENTS OF THE INVENTION

The SAW filter as is shown in FIG. 1, includes a piezoelectric substrate 11, an input electrode 12 and an output electrode 13 with each representing an interdigital electrode disposed on the piezoelectric substrate 11, and two reflectors 14 and 14 disposed on the piezoelectric substrate 11 in an arrangement sandwiching both the input electrode 12 and the output electrode 13 between the reflectors.

The piezoelectric substrate 11 is made of, for example, quartz and is a rectangular plate. The input electrode 12, the output electrode 13, and the reflectors 14 are formed on the surface of the piezoelectric substrate 11 by, for example, depositing a thin film by a process of, for example, evaporating or sputtering conductive metal, and then patterning the film by, for example, photolithography.

The input electrode 12 consists of a pair of comb-shaped electrodes each having electrode fingers 121 and 122 interdigitated with each other. These electrode fingers 121 and 122 are connected at one end to their respective common edges.

Each electrode finger 121 is partially bent at an angle and includes two linear sections 121a and 121b spaced from one another in the direction orthogonal to the propagating direction of the SAWs, and an inclined section 121c interconnecting both of the linear sections 121a and 121b. The linear sections 121a and 121b are spaced at a distance L1=$\lambda$/2 from one another ($\lambda$ represents the wavelength of SAWs) in the propagating direction of the SAWs. The length of the inclined section 121c is preferably minimized as much as possible. Similarly, each electrode finger 122 includes two linear sections 122a and 122b, and an inclined section 122c interconnecting both of the linear sections 122a and 122b.

Therefore, the overlap length al of the electrode fingers 121 and 122 is the sum of an overlap length b1 and an overlap length b2 corresponding to the opposing linear sections 121a and 122b, and the opposing linear sections 121b and 122a, respectively.

The output electrode 13 consists of a pair of comb-shaped electrodes each having electrode fingers 131 and 132 interdigitated with each other. These electrode fingers 131 and 132 are connected at one end to their respective common edges.

Each electrode finger 131 includes two linear sections 131a and 131b separated in the direction orthogonal to the propagating direction of the SAWs, and an inclined section 131c interconnecting both of the linear sections 131a and 131b. The linear sections 131a and 131b are spaced at a distance of $\lambda$/2 from one another in the propagating direction of the SAWs. Similarly, the electrode finger 132 includes two linear sections 132a and 132b, and an inclined section 132c interconnecting both of the linear sections 132a and 132b.

Therefore, the overlap length a1 of the electrode fingers 131 and 132 is the sum of the overlap length b1 and the overlap length b2 corresponding to the opposing linear sections 131a and 132b, and the opposing linear sections 131b and 132a, respectively.

Each reflector 14 is provided with a plurality of electrode fingers 141 arranged at predetermined intervals in the propagating direction of the SAWs. The electrode fingers 141 are short-circuited at both ends.

Each electrode finger 141 is partially bent at an angle and includes two linear sections 141a and 141b separated in the direction orthogonal to the propagating direction of the SAWs, and an inclined section 141c connected to both the linear sections 141a and 141b. The linear sections 141a and 141b are spaced at a distance L2=$\lambda$/2 from one another in the propagating direction of the SAWs.

An operation of the SAW filter according to the first embodiment will now be described with reference to FIG. 1.

Electric signals transmitted to the input electrode 12 is converted to SAWs by the piezoelectric effect. The SAWs propagate to the output electrode 13 in the direction orthogonal to the longitudinal direction of the electrode fingers 121 and 122. The vibrational energy of the SAWs is confined in the region between the reflectors 14 and 14 without leaking.

When the SAWs enter the output electrode 13, a voltage proportional to the amplitude of the SAWs is generated at the electrode fingers 131 and 132. Signals corresponding to a predetermined filter characteristic are extracted and outputted to the exterior.

Here, each electrode finger 121 of the input electrode 12 includes two linear sections 121a and 121b that are spaced at a distance of $\lambda$/2 from one another in the propagating direction of the SAWs. Similarly, each electrode finger 131 of the input electrode 13 includes two linear sections 131a and 131b that are spaced at a distance of $\lambda$/2 from one another in the propagating direction of the SAWs.

Thus, in the input electrode 12, the linear section 121a of the electrode finger 121 and the linear section 122a of the electrode finger 122 are aligned in the same straight line in the direction orthogonal to the propagating direction of the SAWs. Positive and negative voltages are applied to the electrode finger 121 and the electrode finger 122, respectively. This relationship is also applied to the output electrode 13.

In the operation described above, resonance in a transverse mode in which energy is transmitted in the direction orthogonal to the propagating direction of the SAWs is as shown in FIG. 1. Vibrational energy transmitted in first to third-order transverse modes are shown in FIG. 1. Although resonance in the first-order transverse mode in each linear section becomes primary responses, resonance in the second-order or higher transverse modes becomes spurious responses. In particular, while electric charges in the second-order transverse mode in each linear section cancel each other out in the input/output electrodes 12 and 13, electric charges in the third-order transverse mode in each linear section do not cancel each other out and appear as spurious responses in the filter characteristic. That is, electric charges in the odd-order transverse mode in each linear section appear as spurious responses, while electric charges in the even-order transverse mode cancel each other out. However, in the SAW filter of the present invention, the overlap lengths b1 and b2 of the respective liner sections are reduced, while a large total overlap length is maintained. Therefore, spurious responses in the high-order transverse mode can be away from the filter passband and thus effects of undesired spurious responses are eliminated, as shown below by prototypes.

As described above, in the SAW filter of the first embodiment, each electrode finger of the input/output electrodes 12 and 13 has a plurality of linear sections. Although the overlap length of each linear section is small, impedance can be reduced because of the large total overlap length.

Moreover, since each linear section of the input/output electrodes 12 and 13 has a small overlap length, spurious responses in transverse mode are away from the filter passband, and thus, effects of undesired spurious responses can be eliminated.

FIG. 2 illustrates a SAW filter according to a second embodiment of the present invention. The second embodiment is different from the first embodiment in that the total overlap length is increased by increasing the number of the linear sections from two to five in each of the input/output electrodes and the reflectors.

As shown in FIG. 2, the SAW filter of the second embodiment includes a piezoelectric substrate 11, an input electrode 22 and an output electrode 23 that are disposed on the piezoelectric substrate 11 with each representing an interdigital electrode, and two reflectors 24 and 24 disposed on the piezoelectric substrate 11 in an arrangement sandwiching both the input electrode 22 and the output electrode 23 between the reflectors.

The input electrode 22 consists of a pair of comb-shaped electrodes each having electrode fingers 221 and 222 interdigitated with each other. These electrode fingers 221 and 222 are connected at one end to their respective common edges.

Although arranged similarly to the electrode fingers 121 and 122 of the input electrode 12 in FIG. 1, the electrode fingers 221 and 222 are different in that each has five linear sections as shown in FIG. 2. Therefore, the overlap length a1 of the electrode fingers 221 and 222 is the sum of overlap lengths b1 to b5.

For example, the total overlap length a1 is about $100\lambda$, while each of the overlap lengths b1 to b5 is about $15\lambda$ to $20\lambda$.

The input electrode 23 consists of a pair of comb-shaped electrodes each having electrode fingers 231 and 232 interdigitated with each other. These electrode fingers 231 and 232 are connected at one end to their respective common edges.

Although arranged similarly to the electrode fingers 131 and 132 of the output electrode 13 in FIG. 1, the electrode fingers 231 and 232 are different in that each has five linear sections as shown in FIG. 2. Therefore, the overlap length a of the electrode fingers 221 and 222 is the sum of the overlap lengths b1 to b5.

Each reflector 24 is provided with a plurality of electrode fingers 241 arranged at predetermined intervals in the propagating direction of the SAWs. The electrode fingers 141 are short-circuited at both ends. Although arranged similarly to the electrode fingers 141 of the reflectors 14 in FIG. 1, the electrode fingers 241 are different in that each has five linear sections as shown in FIG. 2.

In the SAW filter of the second embodiment, load impedance can be further reduced since the sum of overlap lengths b1 to b5 is larger than that in the first embodiment. Moreover, since each linear section of the input/output electrodes 22 and 23 can have a smaller overlap length, spurious responses in transverse mode are further away from the filter passband, and thus, effects of undesired spurious responses can be eliminated.

EXAMPLE

To determine the effects of the SAW filter of the present invention, prototypes with distances L ranging from 0 to $4\lambda/8$ were made in $\lambda/8$ steps, based on the structure in FIG. 2. Here, the distance L represents the distance between the linear sections, in the propagating direction of the SAWs, in each electrode finger.

The following other conditions are common to these prototypes. The number of the linear sections (tracks) was 15 in, for example, each electrode finger of the input electrode 12 and the output electrode 13. The total overlap length a in the input/output electrodes 12 and 13 was $120\lambda$, while the overlap length of each linear section was $8\lambda$. The center frequency was about 400 [MHz].

FIG. 3($a$–$e$) shows filter characteristics of the described prototypes. In FIG. 3($a$–$e$), these characteristics were measured with the SAW filters having no external matching circuits. If matching circuits are provided, the SAW filter passband is represented by regions x between $\Delta F$ (1) and $\Delta F$ (2).

In FIG. 3($a$–$e$), the distances L of the SAW filter prototypes are as follows: (A) L=0, (B) L=$\lambda/8$, (C) L=$2\lambda/8$, (D) L=$3\lambda/8$, and (E) L=$4\lambda/8$.

The filter characteristics will now be discussed.

FIG. 3($a$) shows the filter characteristic of a prototype with the distance L=0, that is, the filter characteristic corresponding to that of a known filter. Ripples (indicated by dotted circles) caused by spurious responses in the transverse mode appear in the passband x between $\Delta F$ (1) and $\Delta F$ (2).

FIG. 3($b$) shows the filter characteristic of a prototype with the distance L=$\lambda/8$. While reduced compared to the case of the distance L=0, ripples (indicated by dotted circles) caused by spurious responses in the transverse mode still exist in the passband x between $\Delta F$ (1) and $\Delta F$ (2).

FIG. 3($c$) shows the filter characteristic of a prototype with the distance L=$2\lambda/8$. Here, ripples caused by spurious responses in the transverse mode are virtually nonexistent in the passband x between $\Delta F$ (1) and $\Delta F$ (2). However, significant drops (indicated by dotted squares), which are assumed to be phase shifts, appear instead.

FIG. 3($d$) shows the filter characteristic of a prototype with the distance L=$3\lambda/8$. Ripples caused by spurious responses in the transverse mode are nonexistent in the passband x between $\Delta F$ (1) and $\Delta F$ (2). Although a significant drop (indicated by a dotted square), which is assumed to be a phase shift, appears, the phase shift outside the passband x between $\Delta F$ (1) and $\Delta F$ (2) poses no problem to the filter characteristic.

FIG. 3($e$) shows the filter characteristic of a prototype with the distance L=$4\lambda/8$ (that is, L=$\lambda/2$). In this case, a ripple caused by spurious responses in the transverse mode and a significant drop, which is assumed to be a phase shift, are both nonexistent in the passband x between $\Delta F$ (1) and $\Delta F$ (2).

The results above show that although the SAW filter of the present invention satisfying L=$\lambda/2$ is most preferable, the filter satisfying $3\lambda/8 \leq L \leq 5\lambda/8$ poses no practical problem, where L represents the distance of the tracks, which are included in the electrode fingers of the input/output electrodes, etc., in the propagating direction of the SAWs.

As for the filter with the distance L=$5\lambda/8$, the effects are similar to those of the filter with the distance L=$3\lambda/8$, since the positional relationship of their respective linear sections are the same.

Referring to FIG. 4, a SAW resonator of a first embodiment according to the present invention will now be described. FIG. 4 is a plan view showing the structure of the first embodiment according to the present invention. The present embodiment is characterized in that an interdigital electrode 32 includes a plurality of electrode fingers 321 each having two linear sections 321a and 321b, and a plurality of electrode fingers 322 each having two linear sections 322a and 322b.

As shown in FIG. 4, the SAW resonator of the first embodiment includes a piezoelectric substrate 31, the interdigital electrode 32 disposed on the piezoelectric substrate 31, and two reflectors 33 and 33 disposed on the piezoelectric substrate 31 and sandwiching the interdigital electrode 32.

The piezoelectric substrate 31 is made of, for example, quartz and is a rectangular plate. The interdigital electrode 32 and the reflectors 33 are formed on the surface of the piezoelectric substrate 31 by, for example, depositing a thin film by evaporating or sputtering conductive metal, and then patterning the film by, for example, photolithography.

The interdigital electrode 32 consists of a pair of comb-shaped electrodes each having electrode fingers 321 and 322 interdigitated with each other. These electrode fingers 321 and 322 are connected at one end to their respective common edges.

Each electrode finger 321 is partially bent at an angle and includes two linear sections 321a and 321b separated in the direction orthogonal to the propagating direction of the SAWs, and an inclined section 321c connected to both the linear sections 321a and 321b. The linear sections 321a and 321b are spaced at a distance $L1=\lambda/2$ from one another in the propagating direction of the SAWs. Similarly, each electrode finger 322 includes two linear sections 322a and 322b, and an inclined section 322c connected to both the linear sections 322a and 322b.

Therefore, the overlap length a of the electrode fingers 331 and 332 is the sum of an overlap length c1 and an overlap length c2 corresponding to the opposing linear sections 331a and 332b, and the opposing linear sections 331b and 332a, respectively.

Each reflector 33 is provided with a plurality of electrode fingers 331 arranged at predetermined intervals in the propagating direction of the SAWs. The electrode fingers 331 are short-circuited at both ends.

Each electrode finger 331 is partially bent at an angle and includes two linear sections 331a and 331b separated in the direction orthogonal to the propagating direction of the SAWs, and an inclined section 331c connected to both the linear sections 331a and 331b. The linear sections 331a and 331b are spaced at a distance $L2=\lambda/2$ from one another in the propagating direction of the SAWs.

An operation of the SAW resonator according to the first embodiment will now be described with reference to FIG. 4.

Electric signals transmitted to the interdigital electrode 32 is converted to SAWs by the piezoelectric effect. Then the SAWs propagate to both sides of the interdigital electrode 32 in the direction orthogonal to the longitudinal direction of the electrode fingers 321 and 322. The SAWs are reflected by the reflectors 33 and 33 and returned to the interdigital electrode 32.

Here, each electrode finger 321 of the interdigital electrode 32 includes two linear sections 321a and 321b that are spaced at a distance of $\lambda/2$ from one another in the propagating direction of the SAWs.

Thus, in the interdigital electrode 32, the linear section 321a of the electrode finger 321 and the linear section 322a of the electrode finger 322 are aligned in the same straight line in the direction orthogonal to the propagating direction of the SAWs. Positive and negative voltages are applied to the electrode finger 321 and the electrode finger 322, respectively.

In the operation described above, resonance in transverse mode in which energy is distributed in the direction orthogonal to the propagating direction of the SAWs appears similarly to that shown in FIG. 1. Although resonance in the first-order transverse mode in each linear section becomes primary responses, resonance in the second-order or higher transverse modes becomes spurious responses. In particular, while electric charges in the second-order transverse mode in each linear section cancel each other out in the interdigital electrode 32, electric charges in the third-order transverse mode in each linear section do not cancel each other out and appear as spurious responses in the resonance characteristics. However, spurious responses in the transverse mode can be away from the resonance frequency and thus effects of undesired spurious responses are eliminated, as shown below by prototypes.

As described above, in the SAW resonator of the first embodiment, each electrode finger of the interdigital electrode 32 has a plurality of linear sections. Although the overlap length of each linear section is small, impedance at resonance can be reduced because of the large total overlap length.

Moreover, since each linear section of the interdigital electrode 32 has a small overlap length, spurious responses in transverse mode are away from the resonance frequency, and thus, effects of undesired spurious responses can be eliminated.

Referring to FIG. 5, a SAW resonator of a second embodiment according to the present invention will now be described. FIG. 5 is a plan view showing the structure of the second embodiment according to the present invention. The present embodiment is characterized in that each electrode finger of an interdigital electrode 42 includes five linear sections.

As shown in FIG. 5, the SAW resonator of the second embodiment includes a piezoelectric substrate 31, the interdigital electrode 42 disposed on the piezoelectric substrate 31, and two reflectors 43 and 43 disposed on the piezoelectric substrate 31 and sandwiching the interdigital electrode 42.

The interdigital electrode 42 consists of a pair of comb-shaped electrodes each having electrode fingers 421 and 422 interdigitated with each other. These electrode fingers 421 and 422 are connected at one end to their respective common edges.

Although arranged similarly to the electrode fingers 321 and 322 of the interdigital electrode 32 in FIG. 4, the electrode fingers 421 and 422 are different in that each has five linear sections as shown in FIG. 5. Therefore, the overlap length a of the electrode fingers 421 and 422 is the sum of overlap lengths c1 to c5.

For example, the total overlap length a is about $100\lambda$, while each of the separated overlap lengths c1 to c5 is about $15\lambda$ to $20\lambda$.

Each reflector 43 is provided with a plurality of electrode fingers 431 arranged at predetermined intervals in the propagating direction of the SAWs. The electrode fingers 431 are short-circuited at both ends. Although arranged similarly to the electrode fingers 331 of the reflectors 33 in FIG. 4, the electrode fingers 431 are different in that each has five linear sections as shown in FIG. 5.

The described SAW resonator of the second embodiment produces substantially the same effects as those produced by the SAW resonator of the first embodiment.

EXAMPLE

To determine the effects of the SAW resonator of the present invention, a prototype 1 was made based on the structure shown in FIG. 4.

Here, each electrode finger of the interdigital electrode has two linear sections (tracks). Moreover, each track has the distance L=λ/2 in the propagating direction of the SAWs. The total overlap length a of the interdigital electrode 32 is 40λ, while the overlap length of each linear section is 20λ. The operating frequency is about 600 [MHz].

For a comparison of resonance characteristics, the following prototype 2 was made in addition to the prototype 1.

Although having basically the same structure as that of the prototype 1, the prototype 2 has a different distance L=0, which corresponds to that of a known resonator. FIG. 6 provides diagrams of resonance characteristics showing frequency characteristics of the prototype 1 of the SAW resonator according to the present invention and the prototype 2. The resonance characteristics of the prototype 1 and the prototype 2 are shown in FIG. 6(*a*) and FIG. 6(*b*), respectively.

The resonance characteristics of the prototypes 1 and 2 will now be discussed. In the prototype 2 based on the structure of a known resonator, spurious responses appear as shown in FIG. 6(*b*). In the prototype 1, on the other hand, spurious responses are away from the resonance frequency, and thus, the effects of the spurious responses can be eliminated (see FIG. 6(*a*)).

Since the SAW resonator of the present invention behaves similarly to the described SAW filter, the SAW resonators with the distances L=3λ/8 and L=5λ/8 can also eliminate the effects of spurious responses similarly to the case of the prototype 1.

The results above show that although the SAW resonator of the present invention satisfying L=λ/2 is most preferable, the resonator satisfying 3λ/8≦L≦5λ/8 poses no practical problem, where L represents the interval distance of the tracks, which are included in the electrode fingers of the interdigital electrode, etc., in the propagating direction of the SAWs.

According to the present invention, as described above, low impedance as well as elimination of the effects of spurious responses in transverse-mode resonance can be achieved.

I claim:

1. A SAW filter comprising:

a piezoelectric substrate;

input/output electrodes disposed on the piezoelectric substrate and comprising interdigital electrodes each having a plurality of electrode fingers; and two reflectors disposed on the piezoelectric substrate in an arrangement sandwiching the input/output electrodes between the reflectors with each reflector having a plurality of electrode fingers;

wherein each electrode finger of the input/output electrodes is partially bent at an angle and has at least two linear sections spaced a distance L1 from one another in the propagating direction of the SAWs, and with each electrode finger of the reflector being partially bent at an angle and having at least two linear sections spaced a distance L2 from one another in the propagating direction of the SAWs, wherein the distance L1 and the distance L2 satisfy the relationship: 3λ/8≦L1≦5λ/8 and 3λ/8≦L2≦5λ/8, respectively, where λ represents the wavelength of the SAWs.

2. A SAW resonator comprising:

a piezoelectric substrate;

an interdigital electrode disposed on the piezoelectric substrate and comprising a plurality of electrode fingers; and two reflectors disposed on the piezoelectric substrate in an arrangement sandwiching the interdigital electrode between the reflectors with each reflector having a plurality of electrode fingers;

wherein each electrode finger of the interdigital electrode is partially bent at an angle and has at least two linear sections spaced a distance L1 from one another in the propagating direction of the SAWs with each electrode finger of the reflector being partially bent at an angle and having at least two linear sections spaced a distance L2 from one another in the propagating direction of the SAWs, wherein the distance L1 and the distance L2 satisfy the relationship: 3λ/8≦L1≦5λ/8 and 3λ/8≦L2≦5λ/8, respectively, where λ represents the wavelength of the SAWs.

\* \* \* \* \*